United States Patent
Tamaki

(10) Patent No.: US 9,728,689 B2
(45) Date of Patent: Aug. 8, 2017

(54) METHOD OF MANUFACTURING LIGHT EMITTING DEVICE

(71) Applicant: NICHIA CORPORATION, Anan-shi (JP)

(72) Inventor: Hiroto Tamaki, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/241,076

(22) Filed: Aug. 19, 2016

(65) Prior Publication Data

US 2017/0054062 A1    Feb. 23, 2017

(30) Foreign Application Priority Data

Aug. 21, 2015   (JP) ................. 2015-163422

(51) Int. Cl.
| | | |
|---|---|---|
| *H01L 21/00* | (2006.01) | |
| *H01L 33/56* | (2010.01) | |
| *H01L 33/62* | (2010.01) | |
| *H01L 33/50* | (2010.01) | |

(52) U.S. Cl.
CPC ............ *H01L 33/56* (2013.01); *H01L 33/502* (2013.01); *H01L 33/507* (2013.01); *H01L 33/62* (2013.01); *H01L 2933/005* (2013.01); *H01L 2933/0041* (2013.01); *H01L 2933/0066* (2013.01)

(58) Field of Classification Search
CPC ..... H01L 33/56; H01L 33/502; H01L 33/507; H01L 33/62; H01L 2933/0041; H01L 2933/0066; H01L 2933/005

USPC .............................................. 257/98; 438/26
See application file for complete search history.

(56) References Cited

U.S. PATENT DOCUMENTS

| | | | | |
|---|---|---|---|---|
| 5,478,606 A | * | 12/1995 | Ohkuma | ................. B41J 2/1603 216/27 |
| 6,140,018 A | * | 10/2000 | Tochizawa | ............. G03F 7/0005 430/287.1 |
| 7,592,131 B2 | * | 9/2009 | Kubota | .................. B41J 2/1603 430/270.1 |
| 8,597,529 B2 | * | 12/2013 | Kishimoto | ............. B41J 2/1603 216/2 |

(Continued)

FOREIGN PATENT DOCUMENTS

| | | |
|---|---|---|
| JP | 2002-373953 | 12/2002 |
| JP | 2006-108636 | 4/2006 |

(Continued)

*Primary Examiner* — Xinning Niu
*Assistant Examiner* — Vu A Vu
(74) *Attorney, Agent, or Firm* — Mori & Ward, LLP

(57) ABSTRACT

A method of manufacturing a light emitting device includes: providing on a mounting substrate a soluble member which is soluble in a solvent and which has a lower surface, an upper surface opposite to the lower surface in a height direction, and an outer side surface provided between the lower surface and the upper surface, the lower surface contacting the mounting substrate; providing a light blocking member made of resin to cover the outer side surface of the soluble member so that an inner side wall of the light blocking member contacts the outer side surface of the soluble member; removing the soluble member using the solvent to provide a recess surrounded by the inner side wall of the light blocking member; and mounting a light emitting element in the recess.

22 Claims, 11 Drawing Sheets

(56) References Cited

U.S. PATENT DOCUMENTS

| | | |
|---|---|---|
| 2007/0176197 A1 | 8/2007 | Shiraishi et al. |
| 2008/0292993 A1* | 11/2008 | Ishikura ................ B41J 2/1603 430/320 |
| 2009/0086449 A1 | 4/2009 | Minamio et al. |
| 2011/0086447 A1 | 4/2011 | Herrmann |
| 2011/0089401 A1* | 4/2011 | Hiraiwa ................ H01L 33/38 257/13 |
| 2012/0061673 A1* | 3/2012 | Yamazaki ........... H01L 27/1225 257/59 |
| 2012/0097986 A1 | 4/2012 | Ku et al. |
| 2012/0098006 A1* | 4/2012 | Chen .................... H01L 33/486 257/98 |
| 2013/0001629 A1 | 1/2013 | Chen et al. |
| 2013/0001632 A1 | 1/2013 | Imai et al. |
| 2013/0206727 A1* | 8/2013 | Namai ................ C09D 183/04 216/95 |
| 2013/0271999 A1 | 10/2013 | Shiobara et al. |
| 2014/0021503 A1* | 1/2014 | Yoshida ................ H01L 33/641 257/98 |
| 2015/0155456 A1* | 6/2015 | Kuramoto ............... H01L 33/46 257/98 |

FOREIGN PATENT DOCUMENTS

| | | |
|---|---|---|
| JP | 2006-253551 | 9/2006 |
| JP | 2007-201361 | 8/2007 |
| JP | 2009-081346 | 4/2009 |
| JP | 2011-040488 | 2/2011 |
| JP | 2011-526418 | 10/2011 |
| JP | 4944269 | 5/2012 |
| JP | 2012-253223 | 12/2012 |
| JP | 2013-033910 | 2/2013 |
| JP | 2013-221077 | 10/2013 |
| JP | 2014-107307 | 6/2014 |
| JP | 2015-008329 | 1/2015 |

* cited by examiner

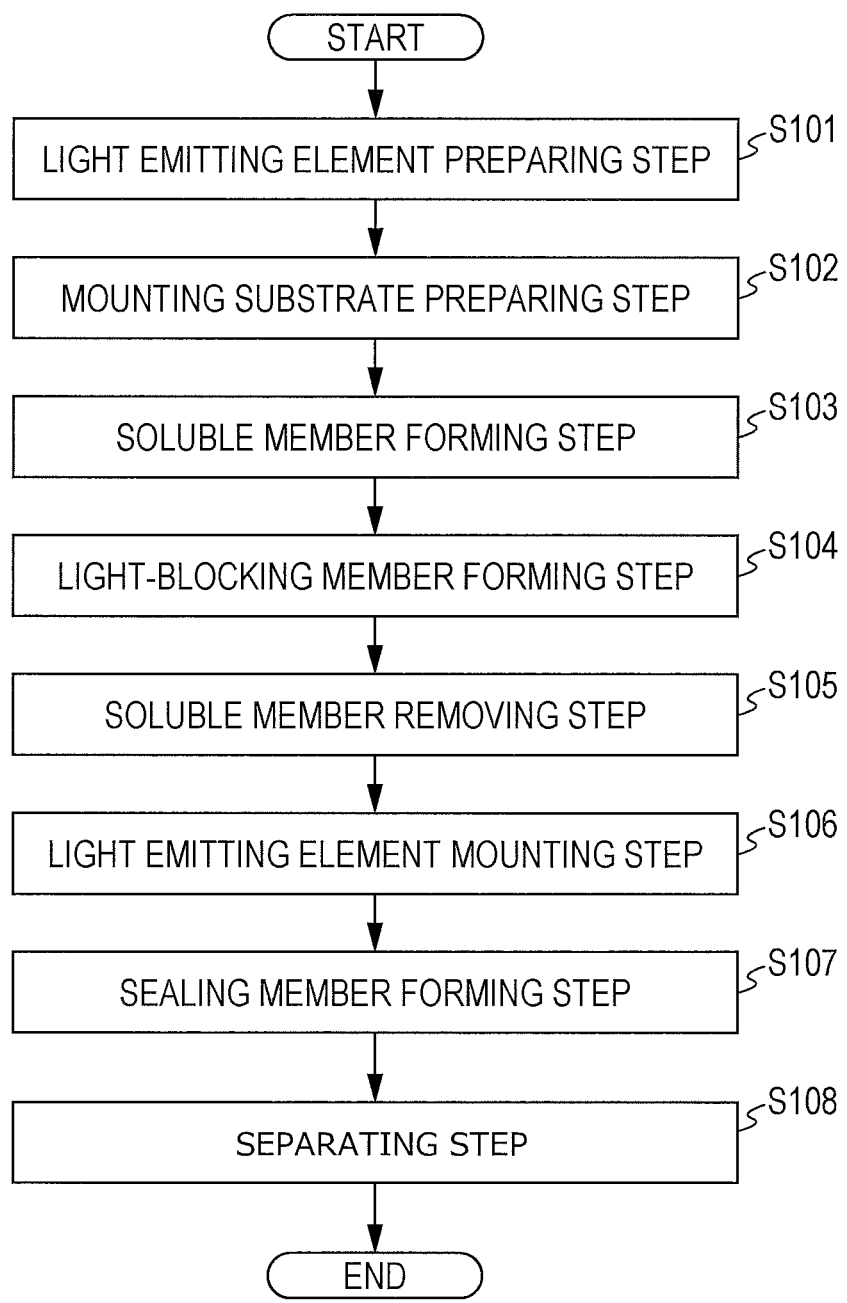

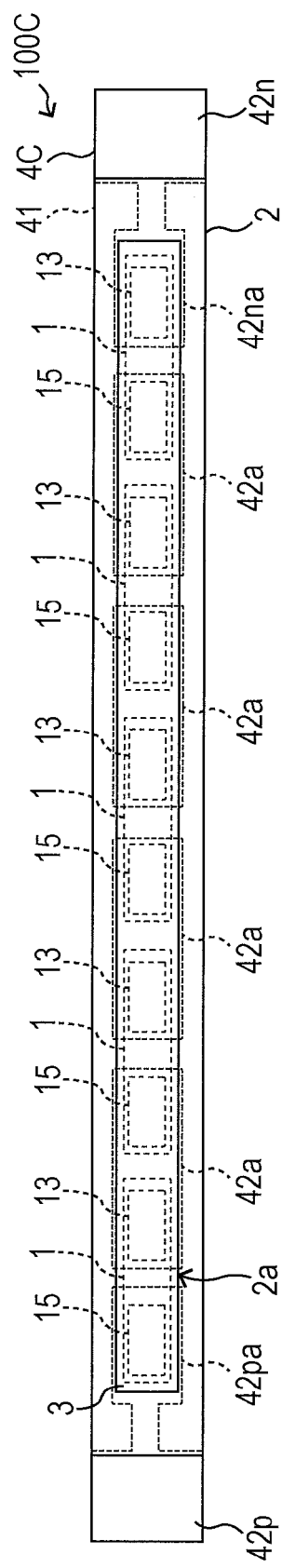

METHOD OF MANUFACTURING LIGHT EMITTING DEVICE

CROSS-REFERENCE TO RELATED APPLICATIONS

The present application claims priority under 35 U.S.C. §119 to Japanese Patent Application No. 2015-163422, filed Aug. 21, 2015, entitled "Method of manufacturing a light emitting device". The contents of this application are incorporated herein by reference in their entirety.

BACKGROUND

Technical Field

The present invention relates to a method of manufacturing a light emitting device.

Discussion of the Background

Light emitting diodes (LEDs) have been used as a backlight source of a display panel of an electronic device. Especially, in recent years, as the electronic device is increasingly thinned and its screen is enlarged, the display panel and a light guide plate are required to be thinned and increased in a screen size, so that the LED is also required to be thinned and achieve a higher output.

Japanese Unexamined Patent Application Publication No. 2006-253551 discloses a method of manufacturing a light emitting device having a reflection case, a terminal member embedded in the reflection case and a light emitting element mounted in a recess portion of the reflection case having an opening on a front side. This reflection case may be formed by resin molding with the terminal member sandwiched by a die.

SUMMARY

According to one aspect of the present disclosure, a method of manufacturing a light emitting device includes: providing on a mounting substrate a soluble member which is soluble in a solvent and which has a lower surface, an upper surface opposite to the lower surface in a height direction, and an outer side surface provided between the lower surface and the upper surface, the lower surface contacting the mounting substrate; providing a light blocking member made of resin to cover the outer side surface of the soluble member so that an inner side wall of the light blocking member contacts the outer side surface of the soluble member; removing the soluble member using the solvent to provide a recess surrounded by the inner side wall of the light blocking member; and mounting a light emitting element in the recess.

According to another aspect of the present disclosure, a method of manufacturing a light emitting device includes: providing each of soluble members on each of mounting substrates, each of the soluble members being soluble in a solvent and having a lower surface, an upper surface opposite to the lower surface in a height direction, and an outer side surface provided between the lower surface and the upper surface, the lower surface contacting each of the mounting substrates; providing light blocking members made of resin, each of the light blocking members covering the outer side surface of each of the soluble members so that an inner side wall of each of the light blocking members contacts the outer side surface of each of the soluble members; removing the soluble members using the solvent to provide recesses, each of the recesses being surrounded by the inner side wall of each of the light blocking members; and mounting each of light emitting elements in each of the recesses.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a schematic flowchart illustrating procedures of a method of manufacturing the light emitting device in the first embodiment;

FIG. 11 is a schematic planer view illustrating a configuration of a light emitting device in a second embodiment.

DESCRIPTION OF THE EMBODIMENTS

Figure 1A:
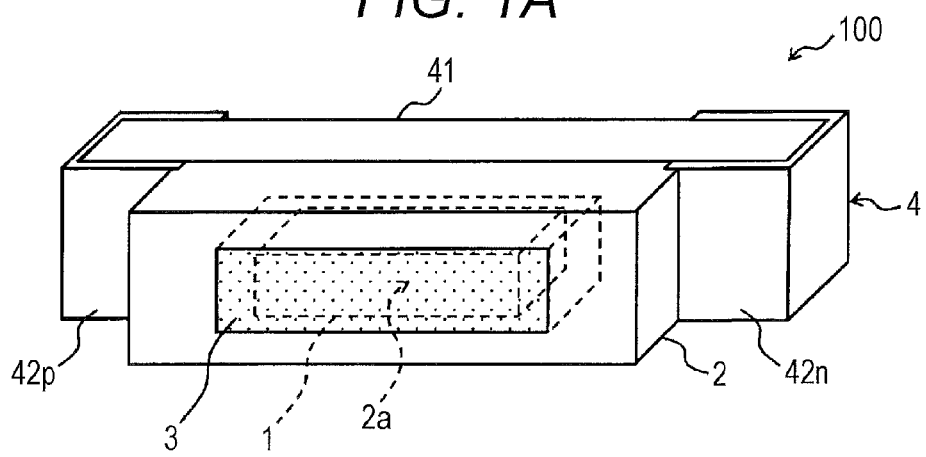
FIG. 1A is a schematic perspective view illustrating a configuration of a light emitting device in a first embodiment.

The embodiments will now be described with reference to the accompanying drawings, wherein like reference numerals designate corresponding or identical elements throughout the various drawings.

Hereinafter, a light emitting device and a method of manufacturing a light emitting device in an embodiment will be described.

Furthermore, since the embodiment is schematically illustrated in the drawings to be referred to, in the following description, a dimension of a member, and a distance and a positional relationship between them are occasionally exaggerated, or illustration of the member is occasionally partially omitted. Furthermore, dimensions of members and distances between them differ between a planer view and a cross-sectional view in some cases. Furthermore, in the following description, the same or similar member is basically marked with the same name or reference, and its detailed description is appropriately omitted.

First Embodiment

Configuration of Light Emitting Device

First, a configuration of a light emitting device in the first embodiment will be described with reference to FIGS. 1A to 1C.

A light emitting device 100 in the first embodiment includes a semiconductor light emitting element 1 (hereinafter, referred to as the light emitting element), a light blocking member 2, a sealing member 3, and a mounting substrate (that is, sub-mount) 4.

The light blocking member 2 is provided on an upper surface of the mounting substrate 4 and has a recess portion 2a (a recess 2a) serving as an opening on that upper surface. In the recess portion 2a, the light emitting element 1 is flip-chip mounted with an electrically-conductive bonding member 43 such as solder. The light-transmissive sealing member 3 is provided in the recess portion 2a to cover an upper surface and outer side surface of the light emitting element 1. Light emitted from the light emitting element 1 can pass through the sealing member 3, and can be externally extracted from the opening of the recess portion 2a of the light blocking member 2.

Next, a configuration of each component of the light emitting device 100 will be sequentially described in detail.

The light emitting element 1 has a substantially cuboidal shape having a horizontally long rectangular shape in planar view. The light emitting element 1 serves as an LED chip suitable for the flip-chip mounting, in which an n-side electrode 13 and a p-side electrode 15 are provided on one surface and bonded to wiring electrodes 42n and 42p of the mounting substrate 4 serving as the sub-mount through the conductive bonding member 43.

The light emitting element 1 is mounted in the recess portion 2a serving as a cavity in which its bottom surface is composed of the upper surface of the mounting substrate 4, and its side wall is composed of the light blocking member 2. Furthermore, the light emitting element 1 is sealed with the sealing member 3 provided in the recess portion 2a.

Here, a configuration example of the light emitting element 1 will be described with reference to FIG. 2 in detail. In addition, in FIG. 2, the surface provided with the n-side electrode 13 and the p-side electrode 15 faces upward, which is opposite to FIG. 1C. Furthermore, the configuration of the light emitting element 1 is simply illustrated in FIGS. 1A to 1C and FIGS. 8A to 10B described below.

The light emitting element 1 includes a substrate 11, a semiconductor laminated body 12, the n-side electrode 13, an overall electrode 14, the p-side electrode 15, and an insulating film 16. The semiconductor laminated body 12 of the light emitting element 1 has an LED structure in which an n-type semiconductor layer 12n, an active layer 12a, and a p-type semiconductor layer 12p are laminated on one main surface of the substrate 11. The semiconductor laminated body 12 emits light when the n-side electrode 13 and the p-side electrode 15 are connected to an external power supply and turned on.

The semiconductor laminated body 12 has an exposed portion 12b in which the p-type semiconductor layer 12p and the active layer 12a are not partially provided, that is, the n-type semiconductor layer 12n is exposed on an upper surface serving as an electrode-forming surface in the semiconductor laminated body 12. The n-side electrode 13 is provided in the exposed portion 12b and electrically connected to the n-type semiconductor layer 12n. Furthermore, the overall electrode 14 having favorable electrical conductivity and light-blocking property is provided on an almost whole upper surface of the p-type semiconductor layer 12p. Still furthermore, the surface of the semiconductor laminated body 12 is covered with the insulating film 16 directly or through the overall electrode 14 except for a part of an upper surface of the exposed portion 12b and a part of an upper surface of the overall electrode 14.

The semiconductor laminated body 12 (the n-type semiconductor layer 12n, the active layer 12a, and the p-type semiconductor layer 12p) is favorably made of nitride semiconductor expressed by $In_XAl_YGa_{1-X-Y}N$ ($0 \leq X$, $0 \leq Y$, $X+Y \leq 1$). Furthermore, each of the substrate 11, the n-side electrode 13, the overall electrode 14, the p-side electrode 15, and the insulating film 16 is made of material favorably used in this field as well as the semiconductor laminated body 12.

Figure 2:
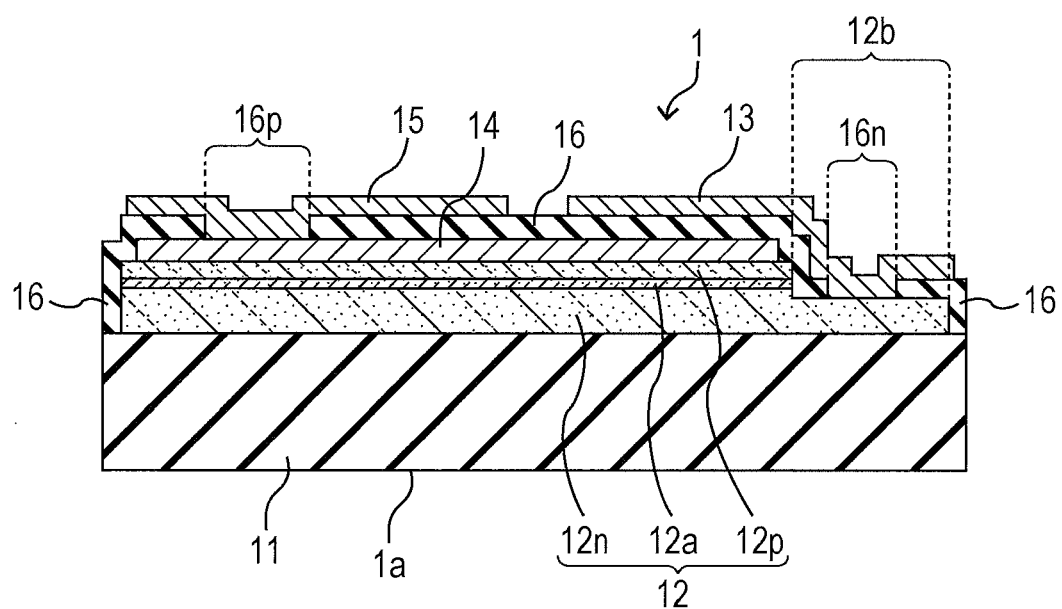
FIG. 2 is a schematic cross-sectional view illustrating a configuration embodiment of a semiconductor light emitting element used in the light emitting device in the first embodiment.

The light emitting element 1 illustrated in FIG. 2 is only one example, and its outline shape, and disposed regions of the exposed portion 12b, the n-side electrode 13, and the p-side electrode 15 can be appropriately changed.

Furthermore, the light emitting element 1 may be a chip size package (CSP) or chip scale package (CSP) type in which a support layer made of a material such as a resin is provided on the electrode-forming surface, and an external connecting metal terminal such as metal bump or post electrode is formed on the n-side electrode 13 and the p-side electrode 15. In this case, the support layer to be provided on the electrode-forming surface of the light emitting element 1 is preferably a resin member containing a light-reflective material. Thus, the light leaked from the electrode-forming surface can be reflected toward the opposite surface, so that light extraction efficiency from the light emitting element 1 can be improved.

Furthermore, the light emitting element 1 may not have the substrate 11.

Returning to FIGS. 1A to 1C again, the description of the configuration of the light emitting device 100 will be continued.

The light blocking member 2 has the recess portion 2a which is provided on the upper surface of the mounting substrate 4 to mount the light emitting element 1. The recess portion 2a has the opening on the upper surface and the opening is larger than the outline of the light emitting element 1 in planer view. Therefore, not only the upper surface but also the outer side surface of the light emitting element 1 can be covered with the sealing member 3 provided in the recess portion 2a.

The light blocking member 2 is a member which can block light. The light blocking member 2 may be made of light-reflective material which blocks the light by reflecting the light, or light-absorbing material which blocks the light by absorbing the light.

In the case where the light blocking member 2 is made of a light-reflective material, the light blocking member 2 reflects the light emitted from the upper surface and the outer side surface of the light emitting element 1 and passed through the sealing member 3, and concentrates it in the opening of the recess portion 2a so that the light can be externally extracted. Thus, light emission brightness from the upper surface of the light emitting device 100 can be improved.

In the case where the light blocking member 2 is made of light-absorbing material, the light blocking member 2 absorbs the light emitted from the outer side surface of the light emitting element 1 and entering the light blocking member 2. Therefore, the light can be emitted only from the upper surface of the light emitting device 100.

Since the light blocking member 2 is provided, whether the light blocking member 2 is made of a light-reflective material or a light-absorbing material, emitting the light from the light emitting device 100 can be limited from the opening of the recess portion 2a of the light blocking member 2, so that the light emitting device 100 can be high in contrast between a light emitting region and a light non-emitting region, that is, its visibility can be improved.

When the light emitting device in this embodiment is used in a backlight device or an illumination device, the following merits are provided.

In a case where the light emitting device is used in a backlight device in which a light guide plate has a light incident end lateral surface, by using the light emitting device 100 increased in front surface brightness, light incident efficiency to the end lateral surface of the light guide plate is enhanced, whereby it is possible to enhance efficiency of the light used as a backlight illumination light.

Furthermore, in a case where the light emitting device is used in a direct type backlight device in which a light guide plate has a light incident end lateral surface is not used, light distribution control can be easily performed with a secondary lens by using the light emitting device 100 having small light emission area. Thus, it is possible to reduce brightness unevenness and color unevenness in the backlight illumination light.

Furthermore, when the light emitting device is used in a general illumination device, light distribution control can be easily performed with a lens by using the light emitting device 100 having small light emission area. Thus, when the plurality of light emitting devices 100 are mounted at a narrow pitch, light emitting from the light emitting devices 100 and being applied to and absorbed or blocked by the adjacent light emitting device 100 can be reduced. That is, the light emitted from the light emitting device 100 can be hardly affected by the adjacent light emitting device 100. As a result, light use efficiency of the illumination device can be hardly affected by a light reflectivity of materials composing the light emitting device 100 such as a base material of the light blocking member 2 constituting the outline of the light emitting device 100, so that a material of the base material can be selected from a variety of options.

The light-reflective material may include a light-reflective property-added resin material provided by mixing a resin having high light-transmissive and insulating properties, with particles of light-reflective substance. The resin can include an epoxy resin and a silicone resin. Furthermore, the light-reflective substance can include a material such as $TiO_2$, $Al_2O_3$, $ZrO_2$, and $MgO$.

Furthermore, the light-absorbing material may include a light-absorbing property-added resin material provided by mixing the same resin material as in the above, with particles of a light-absorbing substance. The light-absorbing substance includes black pigment and favorably includes carbon-based pigment such as carbon black or graphite.

The light blocking member 2 made of the resin material containing the light-reflective substance to have the light-reflective property or the resin material containing the light-absorbing substance to have the light-absorbing property as described above can be formed by a die molding method such as transfer molding, injection molding, or compression molding, or a coating method such as screen printing.

When the light-reflective material is used in the light blocking member 2, the light from the light emitting element 1 can be externally extracted with high efficiency. When the light-absorbing material is used in the light blocking member 2, resin having high moldability can be used, so that reliability of the light emitting device 100 can be enhanced.

As detailed description given below, the light blocking member 2 is provided in such a manner that a region for the recess portion 2a is masked with a soluble member made of material which is dissolved in a solvent, the light blocking member 2 is formed to cover the soluble member, and then the soluble member is dissolved and removed by the solvent, so that the recess portion 2a can be formed with high precision.

Figure 1B:
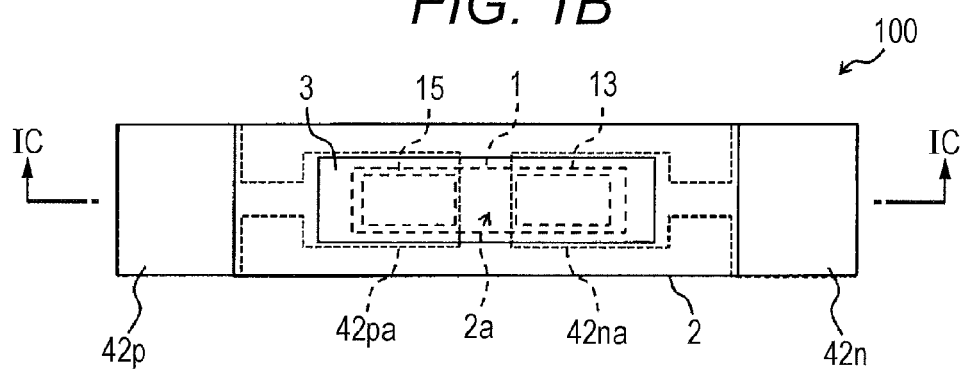
FIG. 1B is a schematic planer view illustrating a configuration of the light emitting device in the first embodiment.
Figure 1C:
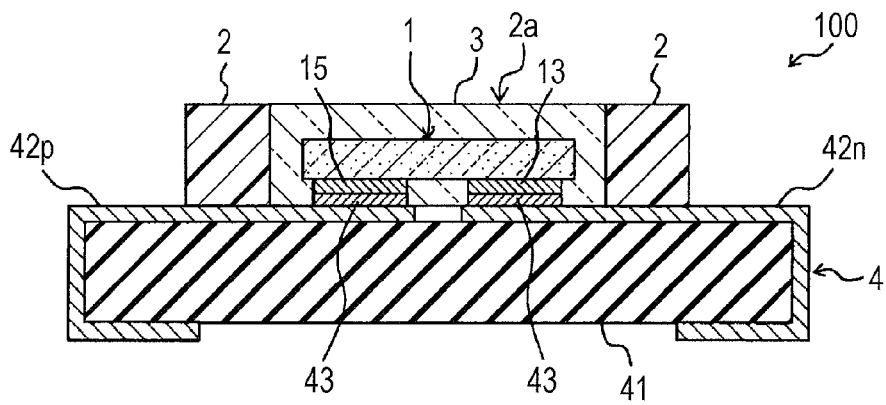
FIG. 1C is a schematic cross-sectional view illustrating a configuration of the light emitting device in the first embodiment, taken along a line IC-IC in FIG. 1B.

The sealing member 3 is provided in the recess portion 2a as illustrated in FIGS. 1A to 1C to seal the light emitting element 1. The sealing member 3 is made of light-transmissive material and provided to cover the upper surface and the outer side surface, that is, the light emission surfaces of the light emitting element 1. An outer surface of the sealing member 3 is in contact with the light blocking member 2.

The sealing member 3 in FIG. 1C is provided on the lower surface of the light emitting element 1, but it may not be provided on the lower surface of the light emitting element 1. The sealing member 3 can provided to cover the light emission surfaces of the light emitting element 1, that is, the upper surface and the outer side surface of the substrate 11 and the side surface of the semiconductor laminated body 12.

The sealing member 3 may be a wavelength conversion member made of a light transmissive resin containing a wavelength conversion substance which can convert the light emitted from the light emitting element 1 to the light having a different wavelength. Furthermore, the sealing member 3 may be a light-diffusing member made of a light transmissive resin containing a light-diffusing substance which diffuses the light emitted from the upper surface and the outer side surface of the light emitting element 1.

Furthermore, the sealing member 3 may be simply made of a light transmissive resin to protect the light emitting element 1.

The wavelength conversion substance may be any fluorescent material. For example, the fluorescent material includes cerium-activated yttrium aluminum garnet (YAG)-based fluorescent material which emits green to yellow light, cerium-activated lutetium aluminum garnet (LAG)-based fluorescent material which emits green light, europium and/or chrome-activated nitrogen-containing calcium aluminosilicate ($CaO$—$Al_2O_3$—$SiO_2$)-based fluorescent material which emits green to red light, europium-activated silicate (($Sr,Ba)_2SiO_4$)-based fluorescent material which emits blue to red light, nitride-based fluorescent material such as β sialon (SiAlON) fluorescent material which emits green light, CASN-based or SCASN-based fluorescent material which emits red light, KSF ($K_2SiF_6$: Mn)-based fluorescent material which emits red light, and sulfide-based fluorescent material which emits green or red light.

The light-diffusing substance may be the same material as the above light-reflective substance.

The sealing member 3 may be made of a light transmissive resin containing a mixture of a plurality of kinds of wavelength conversion substances and light-diffusing substances.

The sealing member 3 can be formed by filling the recess portion 2a with the resin material containing particles of the above-described wavelength conversion substance and/or light-diffusing substance to add various kinds of functions. The resin material may not contain the above-described particles.

The sealing member 3 can formed by a coating method such as spraying, screen printing, or potting (dropping), or a die molding method such as injection molding, transfer molding, or compression molding.

A functional substance such as wavelength conversion substance may include a fragile material such as KSF fluorescent material. When particles of the fragile fluorescent material are used, the fluorescent material particles could be damaged by the method such as spraying by which an impact is applied to the fluorescent material particles at the time of coating, or the method such as screen printing by which a pressure is applied to the fluorescent material particles.

Therefore, when the sealing member 3 is made of the resin material containing the fragile particles, the potting method is preferably used. By the potting method, when slurry containing the fluorescent material particles is applied, a high impact or pressure may not be applied to the particles of the fluorescent material, so that the damage of the fluorescent material particles can be reduced.

According to this embodiment, the sealing member 3 is provided in the recess portion 2a surrounded by the light blocking member 2. Therefore, even when the slurry or a liquid resin is applied by the potting method, the sealing member 3 can be disposed and formed with high precision.

The mounting substrate 4 is the substrate to mount the light emitting element 1 to be packaged. The mounting substrate 4 illustrated in FIGS. 1A to 1C is composed of a plate-shaped base member 41 having a horizontally long rectangular shape in planar view, and the wiring electrodes 42n and 42p continuously provided from the upper surface to the back surface through the outer side surfaces of the base member 41 on the right and left of the base member 41, respectively in a longitudinal direction.

The light blocking member 2 is provided on the upper surface of the mounting substrate 4, the light emitting element 1 is mounted in the recess portion 2a of the light blocking member 2, and the sealing member 3 is provided in the recess portion 2a to seal the light emitting element 1.

The base member 41 may be made of insulating material and preferably made of material having a thermal linear expansion coefficient which is as low as that of the semiconductor laminated body 12 of the light emitting element 1. When the base member 41 is made of the material having the low linear expansion coefficient, a stress applied to the light emitting element 1 may be low when the light emitting element 1 is flip-chip mounted by a reflow method, so that damage of the light emitting element 1 can be reduced.

The material having the low linear expansion coefficient includes a resin material containing glass fiber or glass cloth in a resin such as an epoxy resin, and a ceramic material.

The wiring electrodes 42n and 42p are wiring patterns provided on the surface of the base member 41 to correspond to a negative electrode and a positive electrode and have element mount portions 42na and 42pa serving as regions for mounting the light emitting element 1, respectively. The element mount portion 42na and the element mount portion 42pa are provided in such a manner that their end portions face each other in a center of the upper surface of the base member 41, and they are exposed from the light blocking member 2 in the bottom surface of the recess portion 2a. The element mount portions 42na and 42pa have suitable shapes to mount the light emitting element 1 by flip-chip mounting in the recess portion 2a.

The mounting substrate 4 has a size to inclusively mount the light blocking member 2 provided around the light emitting element 1 in planar view. The wiring electrode 42n is bonded to the n-side electrode 13 of the light emitting element 1 in the element mount portion 42na, and the wiring electrode 42p is bonded to the p-side electrode 15 of the light emitting element 1 in the element mount portion 42pa, with the electrically conductive bonding member 43 such as solder.

Regions of the wiring electrodes 42n and 42p provided on an outer side of the light blocking member 2 in planer view are used when the light emitting device 100 is mounted on an external circuit substrate with a bonding member such as solder.

As for each of the wiring electrodes 42n and 42p, instead of being provided from the upper surface to the lower surface through the side surface of the base member 41, a through hole may be formed in the base member 41 and filled with an electrically conductive material to connect its upper surface pattern to its lower surface pattern, or each of them may be formed only on the upper surface.

Operation of Light Emitting Device

Next, the operation of the light emitting device 100 in the first embodiment will be described with reference to FIGS. 1A to 1C.

In this embodiment, the light emitting element 1 emits blue light, and the sealing member 3 contains particles (wavelength conversion particles) of a fluorescent material (wavelength conversion substance) which absorbs the blue light and emits yellow light.

The light emitting element 1 in the light emitting device 100 emits the blue light when a current is supplied between the n-side electrode 13 and the p-side electrode 15 from the external power supply through the wiring electrodes 42n and 42p of the mounting substrate 4.

The blue light emitted from the light emitting element 1 partially travels in the semiconductor laminated body 12 and the substrate 11 of the light emitting element 1 and enters the sealing member 3 from the upper surface and the outer side surface of the light emitting element 1. The light which travels toward the electrode-forming surface in a lower direction in the light emitting element 1, is reflected upwardly by the overall electrode 14 and the n-side electrode 13, and enters the sealing member 3 from the upper surface or the outer side surface of the light emitting element 1.

The blue light in the sealing member 3 is partially absorbed by the fluorescent material contained in the sealing member 3, converted to the yellow light through wavelength conversion, and externally extracted from the light emitting device 100. Furthermore, at least one part of the blue light in the sealing member 3 is externally extracted from the light emitting device 100 as the blue light without being absorbed by the fluorescent material.

Furthermore, in the case where the light blocking member 2 is made of light-reflective material, the light traveling in the sealing member 3 in a lateral direction is reflected by the inner surface of the recess portion 2a (an inner side wall of the light blocking member 2), that is, by the light blocking member 2, and externally extracted from the upper surface of the sealing member 3 directly or through the light emitting element 1.

Still furthermore, in the case where the light blocking member 2 is made of a light-absorbing material, the light travelling in the sealing member 3 in a lateral direction is partially reflected by an interface between the sealing member 3 and the light blocking member 2, and other light is absorbed by the light blocking member 2.

Thus, white light is externally extracted from the opening provided on the upper surface of the recess portion 2a of the light blocking member 2.

When the sealing member 3 does not contain the fluorescent material, the light emitted from the light emitting element 1 can be externally extracted from the light emitting device 100 without being subjected to the wavelength conversion. Alternatively, when the sealing member 3 contains a large amount of fluorescent material, the light emitted from the light emitting element 1 can be substantially wholly converted to the light having the different wavelength and externally extracted from the light emitting device 100.

The light emitted from the light emitting element 1 enters not only the sealing member 3 provided on the upper surface of the light emitting element 1, but also enters the sealing member 3 provided on the outer side surface of the light emitting element 1. Therefore, even when a large amount of fluorescent material particles are contained, the sealing member 3 can be largely provided on the surfaces of the light emitting element 1, so that the wavelength of the light can be efficiently converted, and the light can be efficiently externally extracted. Especially, even in the case where an amount of fluorescent materials is increased because several kinds of fluorescent materials are contained, the light emitting device 100 can be large in light emission amount, that is, it can be high in brightness.

Method of Manufacturing Light Emitting Device

The method of manufacturing the light emitting device 100 in the first embodiment will be described with reference to FIGS. 3 to 9B.

The method of manufacturing the light emitting device 100 in this embodiment includes a light emitting element preparing step S101, a mounting substrate preparing step S102, a soluble member forming step S103, a light blocking member forming step S104, a soluble member removing step S105, a light emitting element mounting step S106, a sealing member forming step S107, and a separating step S108.

First, in the light emitting element preparing step S101, the separated light emitting element 1 having the configuration illustrated in FIG. 2 is prepared. Hereinafter, the step of manufacturing the light emitting element 1 will be described below as one example, but the commercially available light emitting element 1 may be purchased in the light emitting element preparing step S101.

More specifically, first, the semiconductor laminated body 12 is formed on the substrate 11 made of sapphire by sequentially laminating the n-type semiconductor layer 12n, the active layer 12a, and the p-type semiconductor layer 12p with the above-described semiconductor material. After that, the p-type semiconductor layer 12p and the active layer 12a are wholly etched away in the one region of the upper surface of the semiconductor laminated body 12 to form the exposed portion 12b in which the n-type semiconductor layer 12n is exposed on the upper surface. Furthermore, the substrate 11 may be removed in a subsequent step.

After that, the light-reflective overall electrode 14 is formed to cover almost the whole upper surface of the p-type semiconductor layer 12p.

Subsequently, the insulating film 16 is formed of $SiO_2$ on a surface of a wafer except for openings 16n and 16p serving as a connection region between the n-side electrode 13 and the n-type semiconductor layer 12n and a connection region between the p-side electrode 15 and the overall electrode 14, respectively.

Subsequently, the n-side electrode 13 is formed so as to extend from the opening 16n to the upper surface of the insulating film 16, and the p-side electrode 15 is formed so as to extend from the opening 16p to the upper surface of the insulating film 16.

Thus, the light emitting elements 1 are formed on the wafer.

After that, a predetermined cut region of the wafer is cut by a dicing method or scribing method, whereby the separated light emitting element 1 can be prepared.

Before the wafer is cut, the back surface of the substrate 11 may be thinned by grinding, the substrate 11 may be removed, or the above-described metal bump or post electrode may be formed.

Figure 4A:
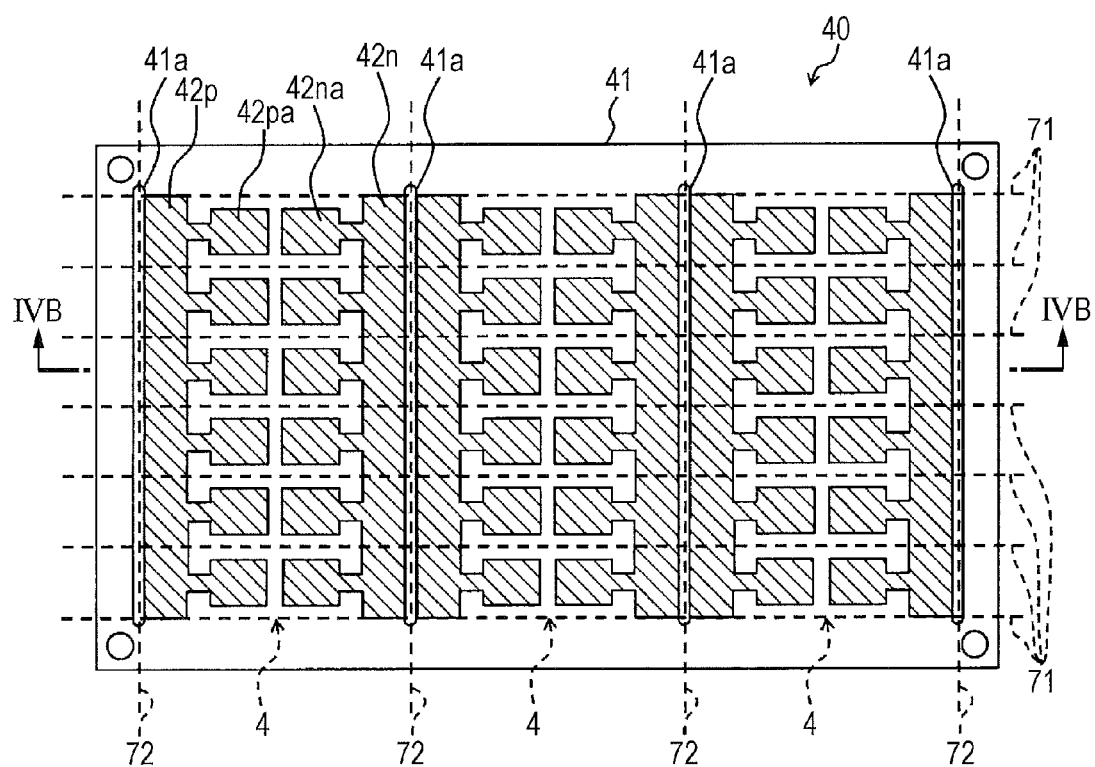
FIG. 4A is a schematic planer view illustrating a configuration of a mounting substrate to be prepared in a mounting substrate preparing step in the method of manufacturing the light emitting device in the first embodiment.
Figure 4B:
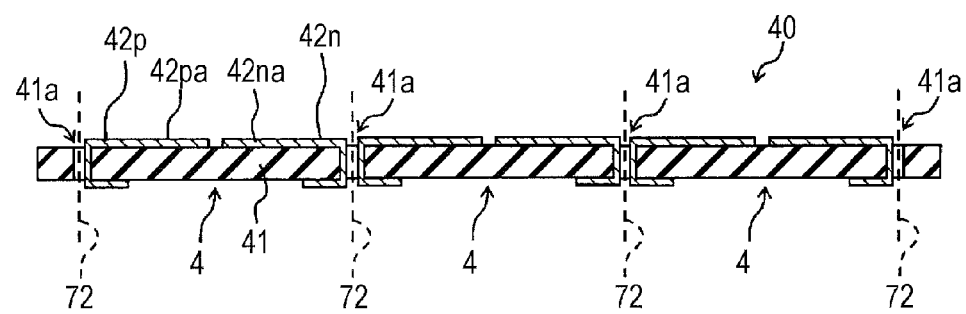
FIG. 4B is a schematic cross-sectional view illustrating a configuration of the mounting substrate to be prepared in the mounting substrate preparing step in the method of manufacturing the light emitting device in the first embodiment, taken along a line IVB-IVB in FIG. 4A.

Then, in the mounting substrate preparing step S102, the mounting substrates 4 are prepared as illustrated in FIGS. 4A and 4B. FIGS. 4A and 4B illustrate an example in which an aggregated substrate 40 has a plurality of sequentially formed base members 41 of the mounting substrates 4. In addition, according to this embodiment, the plurality of light emitting devices 100 are collectively formed on the aggregated substrate 40 until they are separated in the separating step S108.

According to this embodiment, the plurality of light emitting devices 100 are collectively manufactured, but the light emitting device 100 can be manufactured individually.

According to this embodiment, the aggregated substrate 40 is composed of the six mounting substrates 4 in a vertical direction and the three mounting substrates 4 in a horizontal direction which are connected to each other. In FIGS. 4A and 4B, the mounting substrate 4 corresponding to the one light emitting device 100 is partitioned by border lines 71 and border lines 72 serving as virtual lines. Furthermore, the aggregated substrate 40 has grooves 41a formed along the border lines 72 and penetrating the base members 41 in a thickness direction, so that the mounting substrates 4 are previously separated in the horizontal direction. Furthermore, the wiring electrodes 42n and 42p are provided as one pair on the one mounting substrate 4 and each of them extends from the upper surface to the lower surface through the groove 41a of the base member 41. The wiring electrodes 42n and 42p have rectangular regions in the center of the upper surface of the base member 41 as the element mount portions 42na and 42pa which are connected to the n-side electrode 13 and the p-side electrode 15 of the light emitting element 1 when the light emitting element 1 is mounted.

The wiring electrodes 42n and 42p have regions at both end portions of the base member 41 in the longitudinal direction as connection regions to an external circuit substrate or the like when the light emitting device 100 is secondly mounted.

The order of the light emitting element preparing step S101 and the mounting substrate preparing step S102 may be exchanged, or they may be performed in parallel. Furthermore, the mounting substrate 4 may be prepared in a separated state, instead of being prepared on the aggregated substrate 40. Furthermore, as for the wiring electrodes 42n and 42p of the mounting substrate 4, the regions provided on the upper surface and the lower surface of the base member 41 may be electrically connected via a through hole penetrating the base member 41 in the thickness direction of the mounting substrate 4. Still furthermore, the wiring electrodes 42n and 42p of the mounting substrate 4 may be provided only on the upper surface of the base member 41.

Figure 5A:
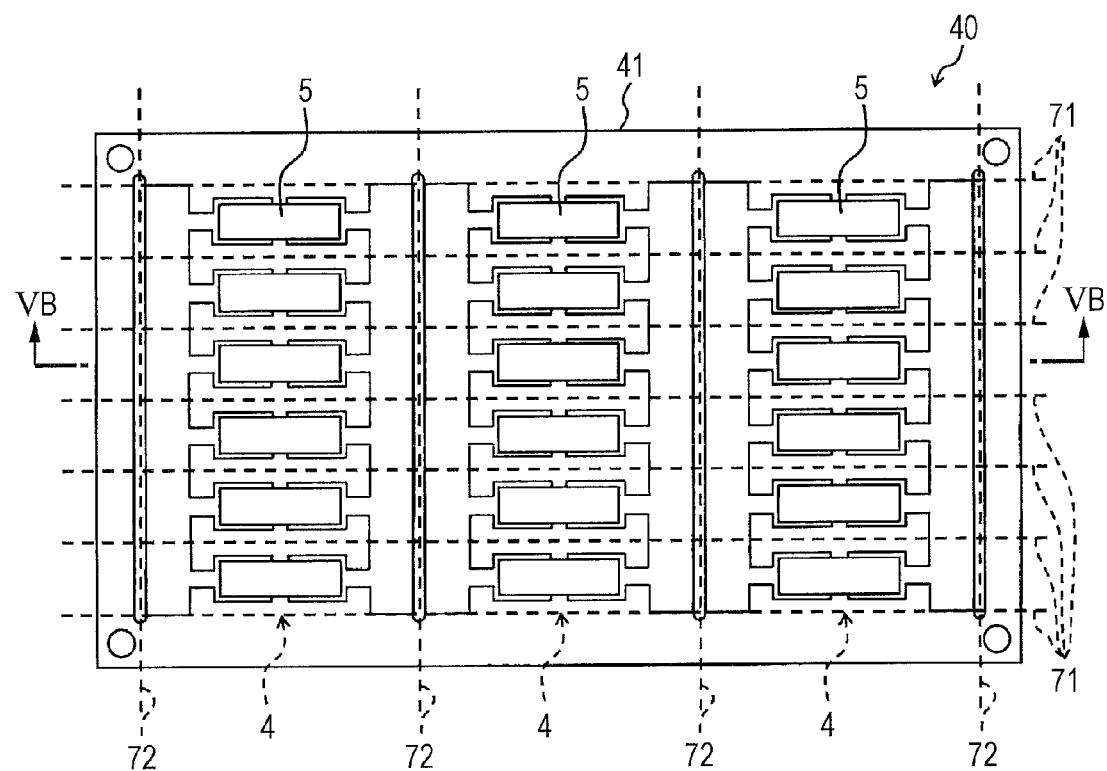
FIG. 5A is a schematic planer view illustrating a soluble member forming step in the method of manufacturing the light emitting device in the first embodiment.
Figure 5B:
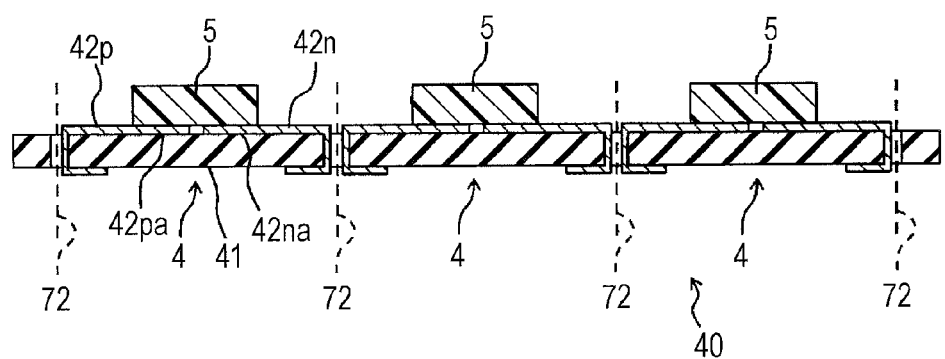
FIG. 5B is a schematic cross-sectional view illustrating the soluble member forming step in the method of manufacturing the light emitting device in the first embodiment, taken along a line VB-VB in FIG. 5A.

Subsequently, in the soluble member forming step S103, as illustrated in FIGS. 5A and 5B, a soluble member 5 is formed of soluble material which is dissolved in a predetermined solvent, on a region of the upper surface of the mounting substrate 4, in which the recess portion 2a of the light blocking member 2 is to be provided.

The soluble member 5 serves as a mask member to reduce the light-blocking material from being applied to the region for the recess portion 2a when the light blocking member 2 is formed in the next light blocking member forming step S104. Therefore, the shape of the recess portion 2a can be determined by the shape of the soluble member 5. For example, when a step is provided in an outer side surface of the soluble member 5 (an outer side surface of the soluble member 5), a step is provided in the inner surface of the recess portion 2a. Furthermore, when the outer side surface of the soluble member 5 is provided as a coarse surface, the inner surface of the recess portion 2a is a coarse surface.

The soluble material is dissolved in the predetermined solvent. The predetermined solvent preferably does not dissolve the material used in the light blocking member 2. As a detailed description given below, the light blocking member 2 is preferably made of an epoxy resin or a silicone resin.

For example, the soluble material includes a negative type and a positive type photoresist materials. Among them, the preferably used photoresist material can be dissolved in a solvent which does not damage the above-descried light-blocking material, a plating material of the base material, and a solder resist, in a developing and removing steps. The photoresist can be removed by a mixed solvent of sulfuric acid and hydrogen peroxide, ozone water, an alkalescent solution such as sodium carbonate or organic alkali, a water based solvent such as ozone-containing acetic acid solution, or an organic solvent such as amine series, N-methyl-2-pyrrolidone (NMP), or ethylene carbonate (EC). Among them, in view of the above-described damage to the base material, the photoresist material which can be developed or removed by the organic solvent or alkalescent solution is preferably used.

The solvent for the soluble material includes ketone based solvent such as acetone or methyl ethyl ketone, and water based solvent such as water, warm water, alkaline aqueous solution.

The negative type photoresist material dissolved in the alkalescent solution includes a material mainly containing polyvinyl cinnamate, a material mainly containing a mixture of cyclized rubber and aromatic bisazide, a material mainly containing a mixture of polymethyl isopropenyl ketone and aromatic bisazide, and a mixture of a polyvinyl phenol resin and aromatic diazide. A method of forming the recess portion 2a with the negative type photoresist material includes the following methods. That is, the liquid photoresist material is applied on the mounting substrate 4 by spin coating, or the film photoresist material is attached thereto, so that the photoresist material is widely applied on the mounting substrate 4. Then, the region on which the recess portion 2a of the light blocking member 2 is to be formed is irradiated with ultraviolet light such as i line to cure the photoresist material. Then, the other portions are developed with an alkalescent solution and dissolved, and a projected portion is formed of the cured photoresist material in the region for the recess portion 2a. Then, the light blocking member 2 is formed around the projected portion made of the photoresist material and then the photoresist material is dissolved and removed.

The positive type photoresist material dissolved in the alkalescent solution includes a material mainly containing a mixture of an alkali soluble phenol resin and naphthoquinone diazide. The alkali soluble phenol resin includes a cresol novolak resin. When the recess portion 2a is formed of the positive photoresist material, for example, the photoresist material is applied on the mounting substrate 4 by a method similar to the above-described case where the negative type photoresist is used, and then the photoresist material formed on the region for the light blocking member 2 is irradiated with ultraviolet light such as g line to make the photoresist material soluble on that region. Then, the photoresist material is developed with the alkalescent solution to be dissolved and removed, whereby a projection portion is formed of the photoresist material. Subsequently, the light blocking member 2 is formed around the projection portion, and then the projection portion made of the photoresist material is dissolved and removed with the alkalescent solution. The positive type photoresist material is preferably used because it becomes soluble in the solvent after the light irradiation, so that when the projection portion is irradiated with the light again before the projection portion is dissolved and removed, the projection portion can be easily dissolved and removed. Furthermore, the positive type photoresist is preferably used because it is not likely to be swollen by a developer, and its sensitivity is steep with respect to the light (that is, contrast is high), so that the shape of the projection portion (that is, the shapes of the recess portion 2a and the light blocking member 2) can be provided with high precision.

In order to improve the precision of the shapes of the recess portion 2a and the light blocking member 2, a contrast enhancing agent composed of nitrone or aromatic diazo compound and water soluble polymer material may be used together with the photoresist material.

In addition, the soluble material which is dissolved in the alkaline aqueous solution may be a novolak resin-based or polyhydroxy styrene-based positive type photoresist material which is used in manufacturing the semiconductor.

Other than the above-described materials, the photoresist material may be a polymethyl methacrylate (PMMA) which can be exposed with short-wavelength ultraviolet light.

The soluble material which is dissolved in the ketone based solvent includes (A) an acrylic resin having a functional group which reacts with an epoxy resin at 40° C. to 80° C. of glass-transition point (Tg), (B) an epoxy resin, (C) a phenol resin, and (D) a resin film composed of tetraphenylphosphonium tetra (p-tolyl) borate.

Here, the acrylic resin in (A) has a hydroxyl group as the functional group which reacts with an epoxy resin, the epoxy resin in (B) is at least one selected from the group consisting of a bisphenol A type epoxy resin, a bisphenol F type epoxy resin, a novolak type epoxy resin, a biphenyl type epoxy resin, and an aliphatic type epoxy resin, the epoxy resin in (B) is contained by 5 parts to 50 parts by mass with respect to 100 parts by mass of the acrylic resin in (A), the phenol resin in (C) is at least one selected from the group consisting of a terpene phenol resin, a bisphenol A type phenol resin, a bisphenol F type phenol resin, and a novolak type phenol resin, and the phenol resin in (C) is contained by 10 parts to 35 parts by mass with respect to 100 parts by mass of the acrylic resin in (A).

In addition, the soluble material has been disclosed in detail in Japanese Patent No. 4944269, so that a detailed description is omitted here.

The soluble material dissolved in the water or warm water includes polyvinyl alcohol, water-soluble polyester, and oblate (starch).

Thus, the soluble material is used to form the recess portion. On the other hand, in a case where the soluble material is used to form the projection portion (that is, the light blocking member), after the light emitting element has been mounted on the mounting substrate, the soluble material is uniformly provided and patterned appropriately to form the light blocking member with the soluble member, and then a sealing member containing the wavelength conversion substance is formed so as to cover the light emitting element. In this case, an unnecessary soluble member could be left as a residue in the subsequent step in the light emitting device, or the sealing member could be insufficiently cured due to an effect of the unnecessary soluble member.

Meanwhile, according to this embodiment, when the soluble member is used to form the recess portion, it is possible to reduce the residual soluble member and a possibility of the insufficient curing of the sealing member.

For example, the soluble member 5 can be formed in such a manner that a sheet-shaped soluble material is attached on the upper surface of the mounting substrate 4, and formed (patterned) into the predetermined shape with a cutter or dicer.

In addition, instead of attachment of the sheet-shaped soluble member 5, the soluble member 5 may be provided such that a soluble material which has been dissolved or dissolved in a solvent is coated on the upper surface of the mounting substrate 4.

Instead, the soluble member 5 may be previously formed into the shape corresponding to the recess portion 2a by cutting a film-shaped soluble material, and attached on the predetermined position on the upper surface of the mounting substrate 4. When the soluble member 5 is made of the photoresist material, it may be patterned by a photolithography method.

In addition, the soluble member 5 is formed to have a film thickness corresponding to the thickness of the light blocking member 2, and the film thickness of the soluble member 5 may be several µm to 1 mm.

Here, the shape of the patterned soluble member 5 determines the shape of the recess portion 2a of the light blocking member 2. Also, in the recess portion 2a, the light emitting element 1 is mounted. Therefore, in the light emitting element mounting step S106 to be described below, the recess portion 2a needs to have a size in which the light emitting element 1 can be mounted in the recess portion 2a. In addition, in the case where the sealing member 3 containing the wavelength conversion substance is formed in the recess portion 2a, the recess portion 2a needs to have a size in which a required amount of the sealing member 3 can be filled to convert the wavelength based on a desired color tone of the emitted light.

Here, the light emitting element 1 may be previously mounted on the mounting substrate 4 in the case where there is concern that the subsequent step is adversely affected by the residual soluble member 5, or in order to reduce the number of steps. Furthermore, in a case where the light emitting element has a structure in which an electrode having almost the same size and shape as those of the lower surface of the light emitting element is provided on the lower surface of the light emitting element, the soluble member is not likely to be left as the residue on the lower side of the light emitting element 1 because almost the whole lower surface of the light emitting element 1 is bonded to the mounting substrate 4, which is preferable.

In addition, as for the shape of the recess portion 2a, that is, the shape of the soluble member 5, in view of mountability of the light emitting element 1, it is preferable that each of lengths directionally corresponding to those of the light emitting element 1 in a planar view (lengths in a vertical and a horizontal directions in the case of a rectangle) is not less than 110% of that of the light emitting element 1, and a height is not more than 500% of that of the light emitting element 1. Furthermore, as for the shape of the soluble member 5, a length ratio with respect to the light emitting element 1 may vary depending on a corresponding direction in planar view.

Furthermore, as for the shape of the soluble member 5, in view of efficiency of the wavelength conversion, it is preferable that a length in planar view is not less than 120% of that of the light emitting element 1, and a height is not less than 100% to not more than 500% of that of the light emitting element 1.

An upper limit of the length of the soluble member 5 in planar view is not limited in particular, but the length is preferably not more than 300% of the corresponding length of the light emitting element 1 to prevent the light emitting device 100 from becoming too large.

Figure 6A:
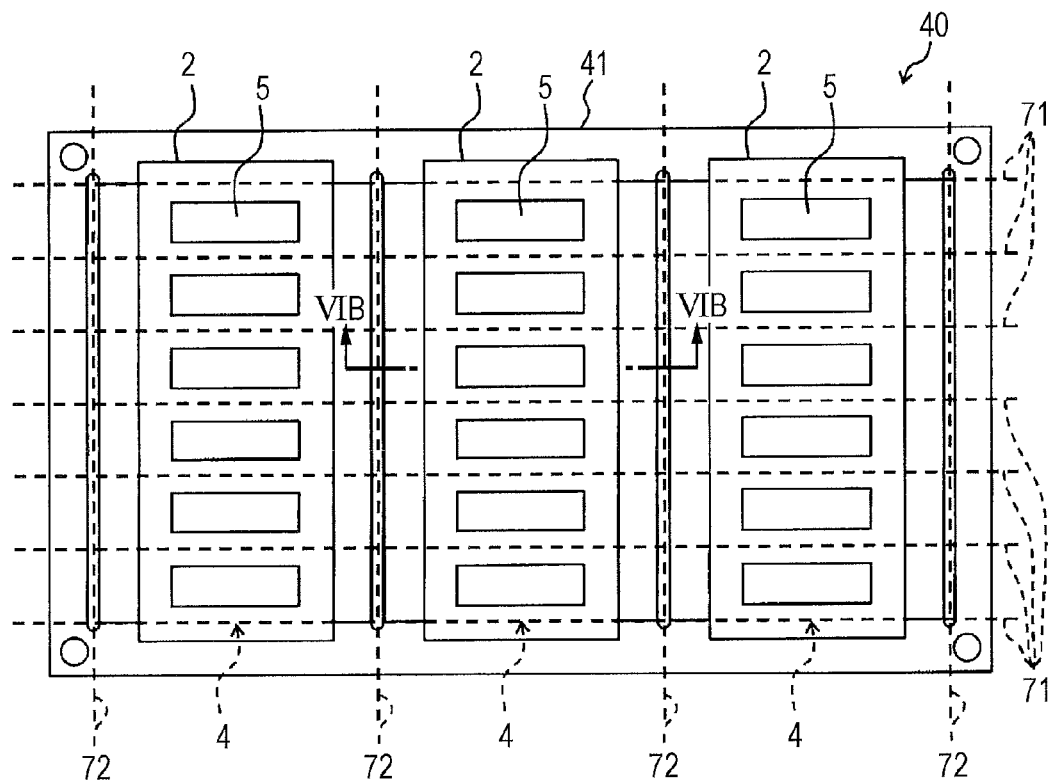
FIG. 6A is a schematic planer view illustrating a light blocking member forming step in the method of manufacturing the light emitting device in the first embodiment.
Figure 6B:
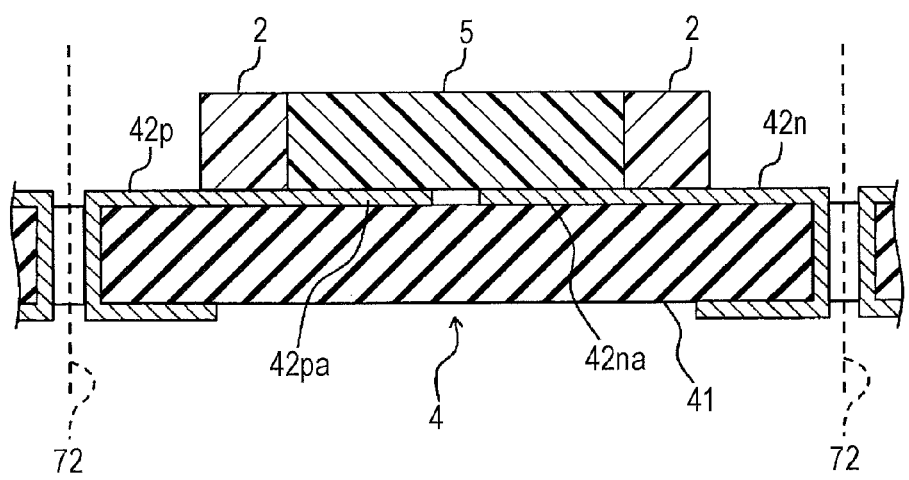
FIG. 6B is a schematic cross-sectional view illustrating the light blocking member forming step in the method of manufacturing the light emitting device in the first embodiment, taken along a line VIB-VIB in FIG. 6A.

After that, as illustrated in FIGS. 6A and 6B, in the light blocking member forming step S104, the light blocking member 2 is formed so as to cover the outer side surfaces of the soluble member 5. The light blocking member 2 may be formed of a light-reflective white resin or a light-absorbing black resin by a method such as transfer molding.

Alternatively, after the light blocking member 2 has been formed up to a height to cover the upper surface of the soluble member 5, the upper surface of the light blocking member 2 may be ground to expose the upper surface of the soluble member 5.

The light blocking member 2 is preferably formed to sequentially cover the outer side surfaces of the plurality of soluble members 5 in a region in which the plurality of soluble members 5 are arranged in a row to correspond to the plurality of light emitting devices 100 as shown in FIG. 6A.

According to this embodiment, the light blocking member 2 is formed continuously for the six soluble members 5 arranged in the vertical direction. Especially, a thin portion of the light blocking member 2 such as the side wall of the recess portion 2a extending in the horizontal direction in planar view is preferably continuously formed across the border line 71. In this case, the thickness at the portion can be increased at the time of resin molding. Thus, the light blocking member 2 can be appropriately molded even when its resin material is high in light reflectivity but low in fluidity because of containing a large amount of light-reflective substance.

That is, when the amount of the light-reflective substance contained in the resin is increased to increase the light-reflective property of the light blocking member 2, the fluidity of the resin could be lowered at the time of molding. In this case, the resin could be insufficiently filled at the time of molding, so that it is sometimes difficult to thinly form the light blocking member 2, especially thinly form the side wall of the recess portion 2a. However, since the side wall of the recess portion 2a is formed after the resin has been sequentially molded and then cut as described above, this portion can be thickly formed compared to a case where this portion is individually formed, so that the light blocking member 2 can be easily filled.

Furthermore, the light blocking member 2 may be formed to sequentially cover the three soluble members 5 arranged in the horizontal direction, or cover all of the soluble members 5 arranged in the vertical direction and horizontal direction. After the resin molding, an unnecessary light blocking member 2 formed in a region such as a region along the border line 72 may be removed by cutting.

According to this embodiment, the light blocking member 2 is not provided in the right and left end portions of the mounting substrate 4, but the light blocking member 2 may be provided in the right and left portions of the mounting substrate 4. In this case, the above-described cutting is not needed after the resin molding.

Figure 7A:
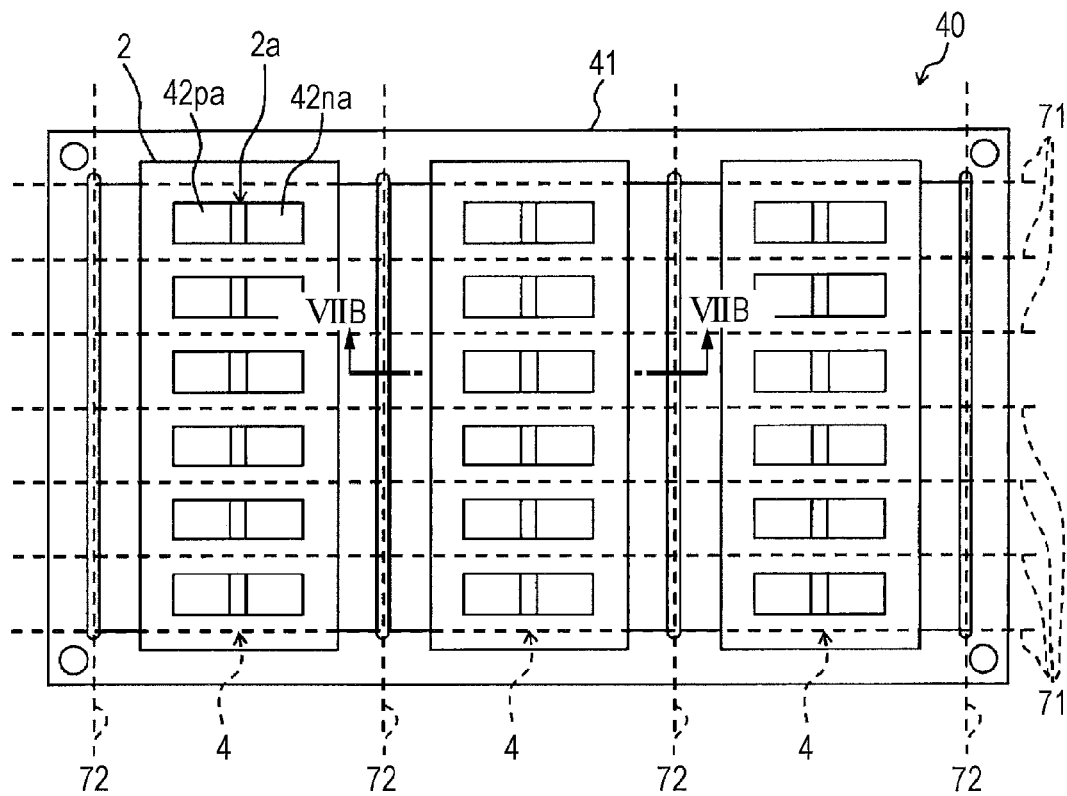
FIG. 7A is a schematic planer view illustrating a soluble member removing step in the method of manufacturing the light emitting device in the first embodiment.
Figure 7B:
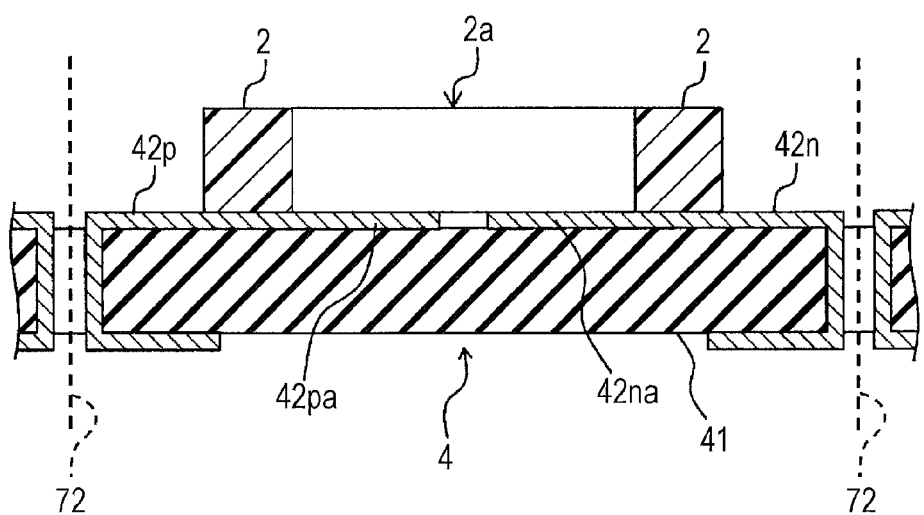
FIG. 7B is a schematic cross-sectional view illustrating the soluble member removing step in the method of manufacturing the light emitting device in the first embodiment, taken along a line VIIB-VIIB in FIG. 7A.

Then, as illustrated in FIGS. 7A and 7B, in the soluble member removing step S105, the soluble member 5 is removed with the above-described predetermined solvent. Thus, an inner surface of the light blocking member 2 is exposed, whereby the recess portion 2a is formed in which this inner surface serves as its inner wall. After the soluble member 5 has been removed, the element mount portions 42na and 42pa of the mounting substrate 4 are exposed on the bottom surface of the recess portion 2a.

Figure 8A:
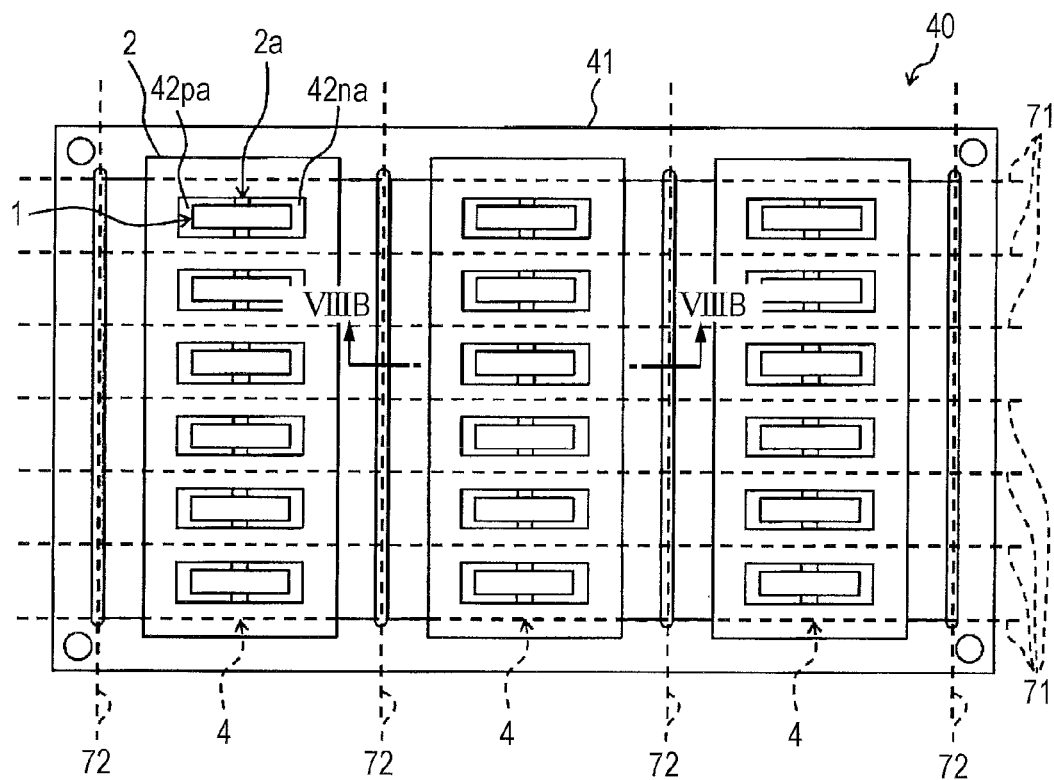
FIG. 8A is a schematic planer view illustrating a light emitting element mounting step in the method of manufacturing the light emitting device in the first embodiment.
Figure 8B:
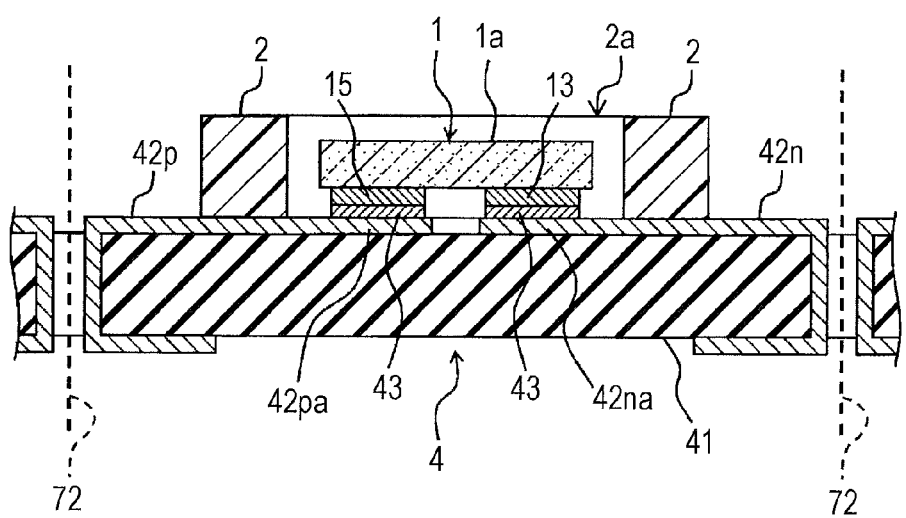
FIG. 8B is a schematic cross-sectional view illustrating the light emitting element mounting step in the method of manufacturing the light emitting device in the first embodiment, taken along a line VIIIB-VIIIB in FIG. 8A.

After that, as illustrated in FIGS. 8A and 8B, in the light emitting element mounting step S106, the light emitting element 1 is mounted in the recess portion 2a formed on the upper surface of the mounting substrate 4. As for a method of mounting the light emitting element 1, flip-chip mounting is preferably performed with a solder by a reflow method. According to this embodiment, an appropriate amount of solder paste serving as the bonding member 43 is applied on the lower surface of the mount surfaces of the n-side electrode 13 and the p-side electrode 15 serving as the pad electrodes, and the light emitting element 1 is mounted in the recess portion 2a with the n-side electrode 13 and the p-side electrode 15 facing the element mount portions 42na and 42pa of the mounting substrate 4, respectively. After that, the solder is dissolved by heat in a reflow furnace, whereby the light emitting element 1 is bonded to the mounting substrate 4 through the bonding member 43.

In a case where a metal wire is used to connect the light emitting element 1 to the wiring electrodes 42n and 42p, or in a case where flip-chip mounting is performed with a bump bonder using ultrasonic vibration, the recess portion 2a needs to have an opening large enough for the insertion of a header portion of a wire bonder or the bump bonder. As for the flip-chip mounting by the reflow method, the opening only needs to be large enough to house the light emitting element 1 and the solder paste, in the recess portion 2a.

Figure 9A:
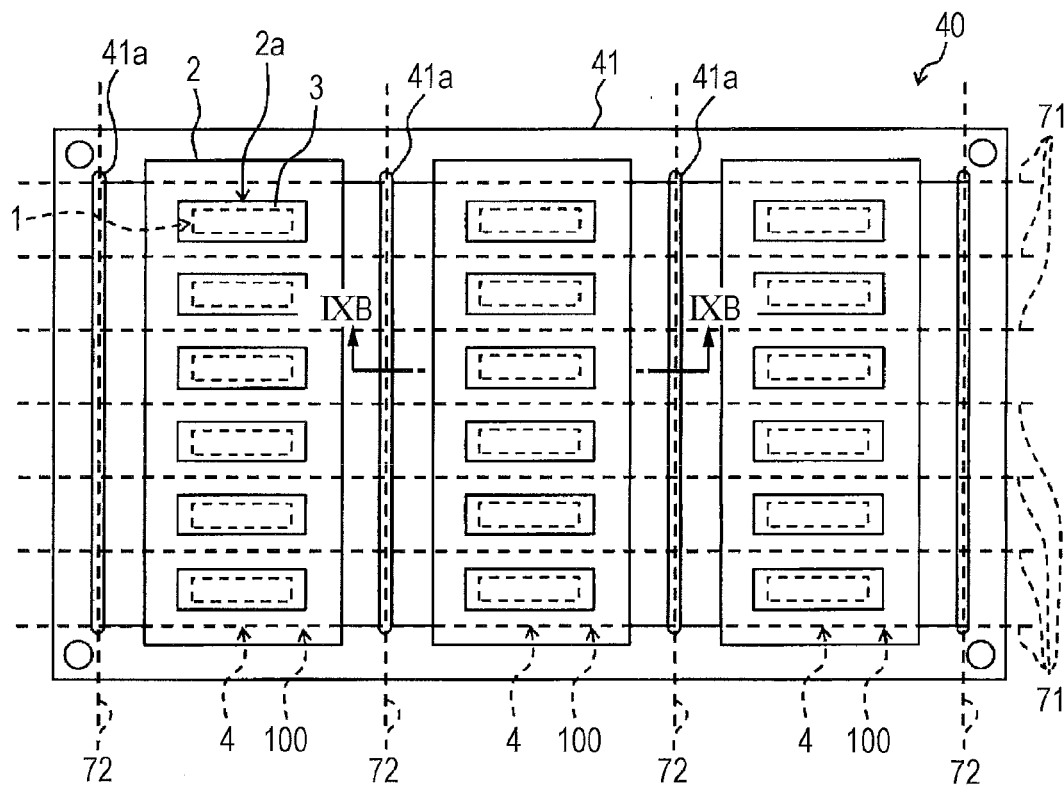
FIG. 9A is a schematic planer view illustrating a sealing member forming step in the method of manufacturing the light emitting device in the first embodiment.
Figure 9B:
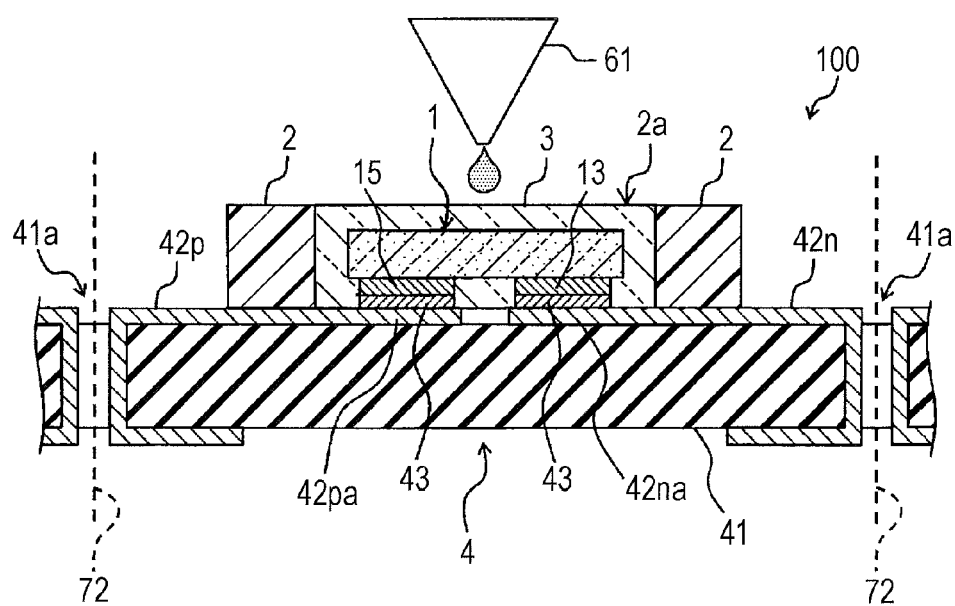
FIG. 9B is a schematic cross-sectional view illustrating the sealing member forming step in the method of manufacturing the light emitting device in the first embodiment, taken along a line IXB-IXB in FIG. 9A.

After that, as illustrated in FIGS. 9A and 9B, in the sealing member forming step S107, the light transmissive resin material is filled in the recess portion 2a with a dispenser 61, and then the resin is cured, whereby the sealing member 3 is formed to seal the light emitting element 1. The resin material can include a thermosetting resin.

Furthermore, in the sealing member forming step S107, another coating method such as a spraying method, or screen printing method may be used other than the potting method.

In a case where the resin material to be filled is slurry containing solid particles such as fluorescent material, the potting method is preferably used because the slurry can be dropped and filled in the recess portion 2a without applying very high impact and pressure to the solid particles contained therein. Therefore, even in the case where the resin material to be used contains the above-described fragile solid particles such as KSF florescent material, the sealing member 3 can be formed without causing serious damage to the solid particles. Furthermore, since the region for the sealing member 3 is surrounded by the recess portion 2a, the sealing member 3 can be formed with high precision even by the potting method.

According to this embodiment, since the shape of the recess portion 2a corresponds to the shape of the soluble member 5, it can be formed with high precision. Therefore, compared with a case where the light blocking member 2 including the shape of the recess portion 2a is formed with a die, the recess portion 2a having the requisite minimum size can be more stably formed. Therefore, the recess portion 2a can be decreased in size, and the light blocking member 2 and accordingly the light emitting device 100 can be decreased in size.

Since the shape of the recess portion 2a can be formed with high precision, the shape of the sealing member 3 can be also formed with high precision. Therefore, in the case where the sealing member 3 contains the particles of the wavelength conversion substance, the amount of the wavelength conversion substance can be stably determined, so that it is possible to reduce a variation in color tone of the light emitted from the manufactured light emitting device 100.

In order to further decrease the size of the light emitting device, there is a method of manufacturing a light emitting device in which the light emitting element 1 is flip-chip mounted on the mounting substrate 4, the light blocking member 2 is formed in contact with the outer side surface of the light emitting element, and the sealing member 3 containing the particles of the wavelength conversion substance is formed in contact with the upper surface of the light emitting element 1.

In order to enhance color rendering properties, the sealing member containing particles of several kinds of wavelength conversion substances may be provided. When the several kinds of wavelength conversion substances are used, a total amount of the needed wavelength conversion substances is increased, especially compared with a case where only a YAG-based fluorescent material having high light emission efficiency is used as the wavelength conversion substance. Therefore, when the sealing member containing the wavelength conversion substances is provided only on the upper surface of the light emitting element, the sealing member is increased in thickness, so that its light transmissivity may be degraded, and the light emitting device may be lowered in brightness.

Thus, according to this embodiment, since the sealing member 3 containing the wavelength conversion substance is provided on the outer side surface in addition to the upper surface of the light emitting element 1, so that the thicknesses of the sealing member 3 can be reduced, so that a large amount of wavelength conversion substance can be used. As a result, even when the large amount of wavelength conversion substance is used, the light emitting device 100 having high brightness can be manufactured.

As for the slurry to be dropped into the recess portion 2a, the resin may be selected to contain particles of the wavelength conversion substance having a specific gravity higher than a specific gravity of the resin. In this case, after the slurry has been dropped, the resin is cured after the particles of the wavelength conversion substance have been precipitated. Thus, the particles of the wavelength conversion substance can be covered with the sufficiently thick resin layer, so that the particles of the wavelength conversion substance can be protected from moisture or gas in the air. Especially, this configuration is preferable when the KSF fluorescent material or quantum dot fluorescent material is used.

After that, in the separating step S108, the aggregated substrate 40 and the light blocking member 2 are cut along the border lines 71 with a dicer, whereby the light emitting device 100 can be separated. According to this embodiment, since the aggregated substrate 40 has been already separated by the grooves 41a along the border lines 72 in the horizontal direction, it is not necessary to cut the aggregated substrate 40 in the horizontal direction in the separating step S108.

In a case where the groove 41a is not provided in the aggregated substrate 40, the aggregated substrate 40 is cut along the border lines 72 in addition to being cut along the border lines 71, whereby the light emitting device 100 is separated.

Through the above steps, the light emitting device 100 can be manufactured.

Variations

Next, light emitting devices in the variations of the first embodiment will be described with reference to FIGS. 10A and 10B.

Figure 10A:
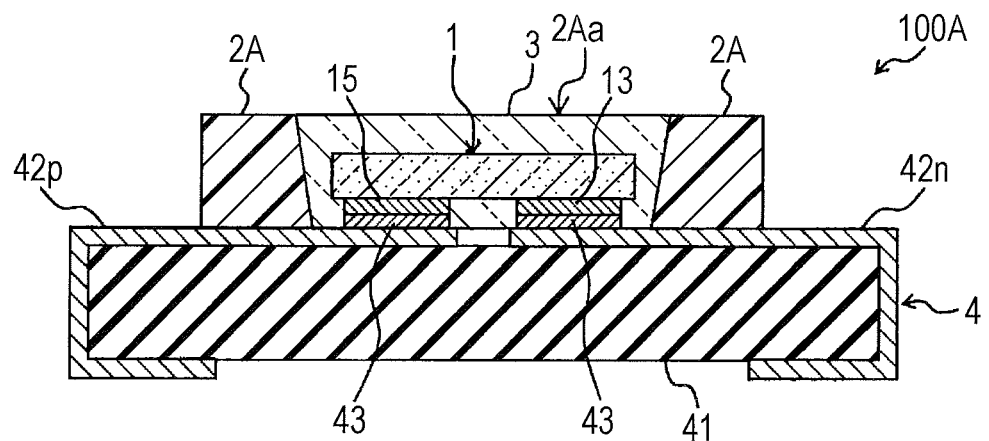
FIG. 10A is a schematic cross-sectional view illustrating a configuration of a light emitting device in a variation of the first embodiment.
Figure 10B:
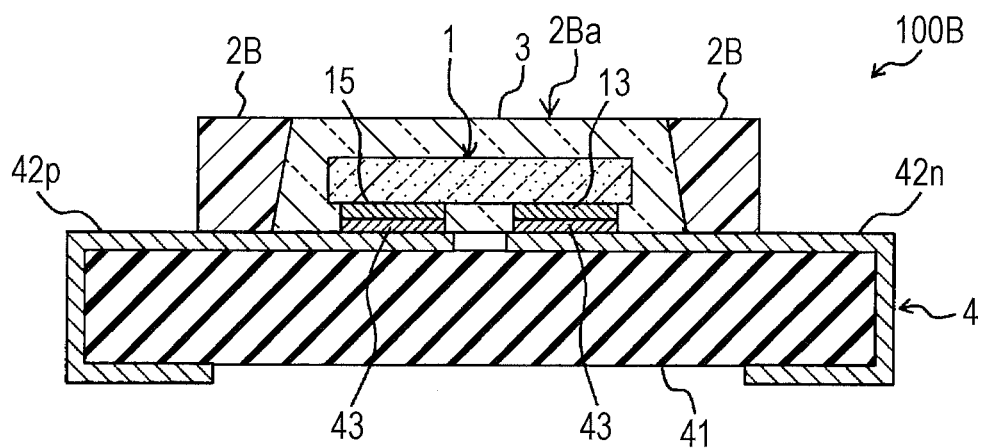
FIG. 10B is a schematic cross-sectional view illustrating a configuration of a light emitting device in another variation of the first embodiment.

The light emitting device 100 illustrated in FIG. 1C is configured such that the inner surface of the recess portion 2a of the light blocking member 2 is substantially perpendicular to the upper surface of the mounting substrate 4, but the inner surface of the recess portion 2a may be inclined, that is, may be tapered as shown in FIGS. 10A and 10B. In this case, only the inner surface in the horizontal direction or only the inner surface in the vertical direction may be inclined in the recess portion 2a in planar view, or an inclined angle may be different between the inner surface in the horizontal direction and the inner surface in the vertical direction.

For example, a light emitting device 100A in the variation of the first embodiment illustrated in FIG. 10A includes a light blocking member 2A having an inclined shape so that an inner surface of a recess portion 2Aa becomes wide as it goes upward, instead of the light blocking member 2. When the inner surface of the recess portion 2Aa is widely inclined as it goes upward, light extraction efficiency can be improved in the light emitting device 100A.

When the inner surface of the recess portion 2Aa is formed into a reversely tapered shape, the light emitting element 1 can be easily inserted into the recess portion 2Aa when the light emitting element 1 is mounted.

A light emitting device 100B in another variation of the first embodiment illustrated in FIG. 10B includes a light blocking member 2B having an inclined shape so that an inner surface of a recess portion 2Ba becomes narrow as it goes upward, instead of the light blocking member 2. When the inner surface of the recess portion 2Ba is narrowly inclined as it goes upward, a light distribution is characterized in that directions of the light emitted from the opening of the recess portion 2Ba can be upwardly converged. Therefore, the light emitting device 100B can be improved in visibility which represents a height of contrast between a light emitting region and a light non-emitting region.

The light emitting devices 100A and 100B are similar to the light emitting device 100 except for the shapes of the recess portions 2Aa and 2Ba, so that their configurations and operations are not described here.

The light emitting devices 100A and 100B can be manufactured similarly to the light emitting device 100 except that the soluble member 5 is formed into the shapes of the recess portions 2Aa and 2Ba in the soluble member forming step S103, in the method of manufacturing the light emitting device 100.

In the soluble member forming step S103, in order to form the tapered inner surface like the recess portion 2Aa or 2Ba, the outer side surface of the soluble member 5 is formed into a tapered shape which is thinned or thickened as it goes upward in a direction perpendicular to the upper surface of the mounting substrate 4, to follow the inner surface of the recess portion 2Aa or 2Ba.

In the case where the inner surface is tapered like the recess portion 2Aa or 2Ba, as for a length in the shape of the recess portion 2Aa or 2Ba in planar view, a length at an upper end of the opening of the recess portion 2Aa or 2Ba is preferably set to be equal to a length of the above-described recess portion 2a of the light emitting device 100.

The outer side surface of the soluble member 5 can be downwardly or upwardly inclined by obliquely cutting the sheet-shaped soluble member 5 at a desired angle with a cutter or dicer mechanically when the soluble member 5 is patterned. Alternatively, after the soluble member 5 has been formed on the upper surface of the mounting substrate 4, the soluble member 5 may be cut or ground with a dicer or cutter so that the outer side surface can be inclined. Still alternatively, in the case where the photoresist is used as the soluble member 5, the photoresist is exposed with an oblique light by use of aberration of a lens to be used in the exposure, exposed with a galvanometer scanner, or exposed with an inclined light source, to form the tapered shape.

As described above, the other steps are similar to those in the method of manufacturing the light emitting device 100, so that their description is omitted here.

Second Embodiment

Next, a configuration of a light emitting device in the second embodiment will be described with reference to FIG. 11.

A light emitting device 100C in the second embodiment is configured such that the plurality (five) of light emitting elements 1 are mounted in the recess portion 2a of the light blocking member 2. Thus, according to the light emitting device 100C in the second embodiment, the plurality of light emitting elements 1 are mounted in the recess portion 2a and provided with a mounting substrate 4C prepared for the plurality of light emitting elements 1, instead of the mounting substrate 4. Other configurations of the light emitting device 100C are similar to those of the light emitting device 100, so that a detailed description is omitted.

The light emitting device 100C has a shape suitable for being used as a linear light source in which the plurality of light emitting elements 1 are linearly disposed in a row.

The light emitting device 100C includes the five light emitting elements 1, and the mounting substrate 4C which is long enough to mount the five light emitting elements 1 linearly arranged in a row in a longitudinal direction. The mounting substrate 4C has four relay wiring electrodes 42a, in addition to the wiring electrodes 42n and 42p for external connection. The four wiring electrodes 42a are disposed in a row to be spaced apart from each other on the upper surface of the base member 41 between the wiring electrodes 42n and 42p in the longitudinal direction. The one light emitting element 1 is disposed with respect to each adjacently disposed pair of wiring electrodes 42n, 42a, and 42p. Therefore, the five light emitting elements 1 are electrically connected in series through the relay wiring electrodes 42a. Furthermore, the light blocking member 2 provided on the upper surface of the mounting substrate 4C has the recess portion 2a large enough to house the five light emitting elements 1 disposed in a row. The sealing member 3 is provided in the recess portion 2a to seal the light emitting elements 1.

As for the size of the recess portion 2a in this embodiment, that is, the shape of the soluble member 5 forming in the manufacturing process, a gap between the light emitting element 1 disposed at the end and an inner surface of the recess portion 2a may be set equally to a gap between the inner surface of the recess portion 2a and the light emitting element 1 described in the first embodiment.

The shape of the light emitting element 1 in planar view is not only a rectangle but also another polygonal shape such as square shape, circular shape, or elliptical shape. Furthermore, the number of the light emitting elements 1 mounted in the one recess portion 2a can be suitably selected, and their layout manner may be such that they are arranged in a short-side direction or two-dimensionally arranged. Still furthermore, the plurality of mounted light emitting elements 1 may be connected in parallel, or both in series and in parallel, instead of only being connected in series.

The shape of the recess portion 2a may have an inclined inner surface like the variations in the first embodiment.

The light emitting device 100C can be operated similarly to the light emitting device 100 except that a power is supplied to the plurality of light emitting elements 1 through the wiring electrodes 42n, 42p, and 42a on the mounting substrate 4C, so that its operation is not described in detail here.

The light emitting device 100C can be similarly manufactured by the method of manufacturing the light emitting device 100 in the first embodiment except that the mounting substrate 4C is prepared in the mounting substrate preparing step S102 to have the shape to mount the plurality of light emitting elements 1 and include the wiring electrodes 42n, 42p, and 42a, and the plurality of light emitting elements 1 are mounted in the light emitting element mounting step S106, so that a detailed description of its manufacturing method is not given here.

In the above, the method of manufacturing the light emitting device in this disclosure has been specifically described by way of the embodiment, but the scope of the present invention is not limited to the above description and should be widely interpreted based on claims. Furthermore, various modifications and variations made based on the above description are included in the scope of the present invention as a matter of course.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting device, comprising:
    providing on a mounting substrate a soluble member which is soluble in a solvent and which has a lower surface, an upper surface opposite to the lower surface in a height direction, and an outer side surface provided between the lower surface and the upper surface, the lower surface contacting the mounting substrate;
    providing a light blocking member made of resin to cover the outer side surface of the soluble member after providing the soluble member on the mounting substrate so that an inner side wall of the light blocking member contacts the outer side surface of the soluble member;
    removing the soluble member using the solvent to provide a recess surrounded by the inner side wall of the light blocking member; and
    mounting a light emitting element in the recess.

2. The method according to claim 1, further comprising:
    providing a sealing member in the recess to seal the light emitting element.

3. The method according to claim 2, wherein the sealing member is made of a light transmissive resin including wavelength conversion particles which convert light emitted from the light emitting element to light having a different wavelength.

4. The method according to claim 3, wherein slurry which includes a liquid resin containing the wavelength conversion particles is dropped in the recess and then the slurry is cured to provide the sealing member.

5. The method according to claim 1, wherein the solvent comprises at least one of a water based solvent, and acetone, methyl ethyl ketone and other ketone based organic solvents.

6. The method according to claim 1,
    wherein the material of which the soluble member is made comprises a photosensitive resin, and
    wherein the soluble member is made using a photolithography method.

7. The method according to claim 1,
    wherein the mounting substrate comprises
        a base member made of an epoxy resin containing glass fiber, and
        an electrode disposed on a surface of the base member to be connected to the light emitting element, and
    wherein the light emitting element is flip-chip mounted on the mounting substrate using a reflow method.

8. The method according to claim 1, wherein the soluble member has a tapered shape which tapers in the height direction from the lower surface toward the upper surface.

9. The method according to claim 1, wherein the soluble member has a tapered shape which tapers in the height direction from the upper surface toward the lower surface.

10. The method according to claim 1, wherein a length of the soluble member in an extending direction is not less than 110% and not more than 300% of a length of the light emitting element in the extending direction viewed in the height direction.

11. The method according to claim 1, wherein a height of the soluble member in the height direction is not less than 100% and not more than 500% of a height of the light emitting element in the height direction.

12. The method according to claim 1, wherein the lower surface of the soluble member directly contacts the mounting substrate.

13. The method according to claim 1, wherein the inner side wall of the light blocking member directly contacts the outer side surface of the soluble member.

14. The method according to claim 1,
wherein the providing on the mounting substrate the soluble member includes providing a plurality of soluble members on the mounting substrate, each of the soluble members having an outer side surface provided between a lower surface and an upper surface, and
wherein the providing the light blocking member includes providing the light blocking member to cover the outer side surface of each of the soluble members.

15. The method according to claim 1, wherein the resin is free of photoresist material.

16. The method according to claim 1, wherein the light blocking member is provided using a different process from a photolithographic process.

17. The method according to claim 1, wherein the light blocking member is provided using a die molding method or a coating method.

18. A method of manufacturing light emitting devices, comprising:
providing each of soluble members on each of mounting substrates, each of the soluble members being soluble in a solvent and having a lower surface, an upper surface opposite to the lower surface in a height direction, and an outer side surface provided between the lower surface and the upper surface, the lower surface contacting each of the mounting substrates;
providing light blocking members made of resin after providing the soluble members on the mounting substrates, each of the light blocking members covering the outer side surface of each of the soluble members so that an inner side wall of each of the light blocking members contacts the outer side surface of each of the soluble members;
removing the soluble members using the solvent to provide recesses, each of the recesses being surrounded by the inner side wall of each of the light blocking members; and
mounting each of light emitting elements in each of the recesses.

19. The method according to claim 18,
wherein the soluble members are disposed in a matrix form, and
wherein the light blocking members are sequentially provided.

20. The method according to claim 18, wherein the resin is free of photoresist material.

21. The method according to claim 18, wherein the light blocking member is provided using a different process from a photolithographic process.

22. The method according to claim 18, wherein the light blocking member is provided using a die molding method or a coating method.

* * * * *